(12) United States Patent
Venturelli et al.

(10) Patent No.: US 11,990,829 B2
(45) Date of Patent: May 21, 2024

(54) CIRCUIT ARRANGEMENT FOR REGULATING A VOLTAGE, CORRESPONDING SYSTEM AND METHOD

(71) Applicant: STMicroelectronics S.r.l., Agrate Brianza (IT)

(72) Inventors: Matteo Venturelli, Lonato del Garda (IT); Nicola De Campo, Cura Carpignano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 202 days.

(21) Appl. No.: 17/698,791

(22) Filed: Mar. 18, 2022

(65) Prior Publication Data

US 2022/0311321 A1 Sep. 29, 2022

(30) Foreign Application Priority Data

Mar. 29, 2021 (IT) .................. 102021000007619

(51) Int. Cl.
*H02M 1/00* (2006.01)
*H02M 3/07* (2006.01)
(Continued)

(52) U.S. Cl.
CPC ....... *H02M 1/0045* (2021.05); *H02M 1/0085* (2021.05); *H02M 3/07* (2013.01); *H02P 7/29* (2013.01); *H02P 7/293* (2016.02)

(58) Field of Classification Search
CPC .... H02M 3/07; H02M 1/0045; H02M 1/0085; H02P 7/293; H02P 7/29; H03K 17/063; H03K 2217/0081
(Continued)

(56) References Cited

U.S. PATENT DOCUMENTS 10,469,066 B1 * 11/2019 Shankar ............... H02P 7/28
10,594,210 B1 * 3/2020 Mercer ............ H03K 17/063
(Continued)

FOREIGN PATENT DOCUMENTS

EP 1081836 A2 3/2001

OTHER PUBLICATIONS

Bayer et al., "Charge Pump with Active Cycle Regulation—Closing the Gap between 1 Linear- and Skip Modes," *IEEE*, 2000, pp. 1497-1502.

(Continued)

*Primary Examiner* — Gabriel Agared
(74) *Attorney, Agent, or Firm* — Seed IP Law Group LLP

(57) ABSTRACT

A configurable voltage regulating circuit includes first through fourth switches. A flying capacitor is coupled between a common mode node and a pump node, and a sense resistance network is coupled between an output node and an input of an error amplifier and configured to provide a sensed output voltage. The error amplifier receives at another input a reference voltage and generates an error signal. A charging circuit supplies a charging current to the pump node, and controls the value of the charging current as a function of the error signal. A switch command signals generator generates respective first, second, third, and fourth switch signals to control the first switch, second switch, third switch, and fourth switch. The generator sets the configurable voltage regulating circuit as either a charge pump or a linear regulator based the input voltage being less than a first threshold or greater than a second threshold.

20 Claims, 11 Drawing Sheets

(51) Int. Cl.
*H02P 7/29* (2016.01)
*H02P 7/293* (2016.01)

(58) Field of Classification Search
USPC .......................................................... 318/103
See application file for complete search history.

(56) References Cited

U.S. PATENT DOCUMENTS

| | | | |
|---|---|---|---|
| 10,734,893 B1* | 8/2020 | Abesingha | H02M 3/07 |
| 10,804,799 B2* | 10/2020 | Stevenson | H02M 3/07 |
| 10,873,256 B1* | 12/2020 | Wu | H02M 3/07 |
| 2007/0252564 A1 | 11/2007 | De Nisi et al. | |
| 2009/0085538 A1 | 4/2009 | Miguchi et al. | |
| 2012/0235730 A1* | 9/2012 | Quan | H02M 3/07 |
| | | | 327/536 |
| 2020/0403607 A1* | 12/2020 | Escudero Rodriguez | |
| | | | H03K 17/063 |

OTHER PUBLICATIONS

ON Semiconductor, "LDO Regulator—Very Low Quiescent Current, Charge Pump Boost Converter 150 mA," Datasheet, Publication Order Number NC48220/D, Rev. 1, Sep. 2019, www.onsemi.com, pp. 1-17.

Yu et al., "A Hybrid Regulator with Boost Charge Pump and Low-Dropout Linear Regulation," *IEEE*, 2010. (3 pages).

\* cited by examiner

# CIRCUIT ARRANGEMENT FOR REGULATING A VOLTAGE, CORRESPONDING SYSTEM AND METHOD

BACKGROUND

Technical Field

The present disclosure is generally directed to a circuital arrangement for regulating a voltage, and more particularly, to such a circuital arrangement which may be used in connection with controlling brushless DC motors.

Description of the Related Art

Automotive integrated circuits are very demanding in terms of performance and reliability over time: they should withstand extreme operating condition, due to the wide range of environmental condition (e.g., temperatures, battery voltage, etc.) that a vehicle meets during its life. The design of circuit that keeps the performance over this wide range is a big challenge.

Automotive requirement forces to improve existing architecture in order to match the environmental constraints. In particular, circuits that are directly connected to battery should guarantee performance even if the battery is very low.

In some automotive applications (e.g., electronic power steering, transmission, etc.), three phase BLDC, or brushless DC, motor is fundamental. The motor control comprises usually three half bridges where each half bridge is made of two N-channel FET, the low side coupled between ground and phase node and the high side coupled between the battery voltage and phase node.

These FET are controlled by a dedicated pre-driver. A key parameter of the motor control is the gate source voltage, VGS, that the pre-driver is able to provide on external FET. VGS voltage should be controlled since it has a direct impact on FET driving performance (i.e., ON resistance) and, in case of too low value, can lead to a degradation on motor performance (speed, torque).

This voltage is generated by an on-chip power supply which has to guarantee a range of gate source voltage VGS typically between 8V and 12V. The minimum value is important to allow a correct driving of the motor, while the maximum value is necessary or desirable to avoid absolute maximum ratings violation.

Even if the battery voltage can be lower or higher than gate source voltage VGS, the gate source voltage VGS should stay within the typical range. For example, when battery is nominal (12V, 24V or 48V depending on the vehicle) gate source voltage VGS is lower than the battery voltage, while when the device operates in low battery condition (down to 4.5V) gate source voltage VGS is higher than battery. Since the battery voltage is the input voltage of this power supply stage, the regulated output voltage has to function even if the input voltage is greater or lower than the output voltage.

Given a certain input voltage (battery voltage) a power supply architecture that can generate an output voltage higher or lower than the input voltage is the cascade of a charge pump regulator and a linear regulator. The charge pump regulator is able to generate an output voltage higher than the input; the linear regulator is able to generate an output voltage lower than input voltage.

In FIG. 1 it is shown an example of such prior art arrangement.

A circuit 10, which may be an integrated circuit, includes a charge pump regulator 11 receiving at an input node I of the circuit 10 an input voltage VIN which may be in particular a battery voltage. The output voltage of the charge pump 11, an increased voltage VOUTH, which ideally is VOUTH=2×VIN, is supplied to the input of a linear regulator 12 which output voltage VOUT, formed at an output node O, which is the output of the linear regulator 12, is brought as regulated supply voltage to a driver, or pre-driver, 20, which output is coupled to the gate of a FET transistor 30. The output voltage VOUT is a regulated voltage so that the driver 20 supplies a regulated gate source voltage VGS to the FET 30. Such FET transistor 30, as mentioned is one of the switches of a bridge or half bridge circuit used to drive an electric motor. The other supply terminal and the source of the FET 30 are coupled. The driver 20 at its input usually receives a PWM signal from a PWM control circuit, both the PWM signal and PWM control circuit not shown in FIG. 1. To the output node O a plurality of pairs of drivers 20 and FET transistors 30 may be coupled, e.g., three for driving three phases of the electric motor.

The use of two regulators, one in series to the other, requires a great amount of silicon area in the integrated circuit, thus increasing production cost of integrated circuit.

Then, current consumption is critical for many applications, therefore increasing the number of regulators means to increase the current consumption of the integrated circuit.

BRIEF SUMMARY

On the basis of the foregoing description, the need or desire is felt for solutions which overcome one or more of the previously outlined drawbacks.

Embodiments of the present disclosure relate to a circuital arrangement for regulating a voltage, which is configured to generate an output voltage higher than an input voltage and an output voltage lower than input voltage.

Embodiments of the present disclosure relate in particular to a circuital arrangement for controlling an electric motor comprising a plurality of half bridge circuit which transistor are driven by a respective driver circuit, providing a controlled gate source voltage to each said transistor, said driver circuit being supplied a regulated voltage through a voltage regulator regulating an input voltage generated by an on-chip power supply.

According to one or more embodiments, technical benefits may be achieved through a circuit having the features specifically set forth herein. Embodiments moreover concern a related system as well as a corresponding method.

As mentioned in the foregoing, the present disclosure provides solutions regarding an electronic circuit for regulating a voltage received at its input comprising
 a configurable voltage regulating circuit comprising
 a first switch coupled between the input node and a common mode node, a second switch being coupled between said common mode node and a ground node,
 a flying capacitor coupled between the common mode node and a pump node,
 a third switch coupled between the input node and a pump node and a fourth switch coupled between the pump node and an output node of the circuit for regulating a voltage,
 the circuit further comprising a sense resistance network, in particular a resistance divider, coupled between the output node and the input of an error amplifier to provide at such input a sensed output voltage, said error amplifier receiving at its other input a reference voltage and generating an error signal, a charging circuit supplying a charging current to said pump node, said charging circuit controlling the value of said charging current as a function of said error control signal, a generator of switch command signals configured to generate respective first, second, third and fourth switch signal to control respectively said first switch, second switch, third switch, fourth switch, said generator if the input voltage is lower than a first threshold said generator being configured to set the configurable voltage regulating circuit as charge pump by generating the first and second switch signal driven by opposite phases of a clock signal to couple alternatively the common mode to the input voltage and the ground, the third and fourth switch signal are driven by opposite phases of said clock signal to couple alternatively the pump node to the output node and to the charging circuit, if the input voltage is greater than a second threshold said generator being configured to set the configurable voltage regulating circuit as linear regulator by generating a first switch signal keeping the first switch open and a second, third and fourth switch signal keeping the second, third and fourth switch closed.

In variant embodiments, said configurable regulating circuit comprises a voltage monitoring circuit configured to monitor the value of the input voltage and to issue a respective first operation command or second operation mode command to said generator of switch command signals, depending on the value of the input voltage being lower than a first threshold or higher than a second threshold.

In variant embodiments, a tank capacitor is coupled between the output node and the ground.

In variant embodiments, said charging circuit is a controlled current generator

In variant embodiments, said controlled current generator is coupled between the input node and the pump node.

In variant embodiments, said controlled current generator is coupled between the pump node and the output node In variant embodiments, said charging circuit includes a PWM signal generator generating a PWM signal proportional to said error signal, said PWM signal driving the open and closed state of said third switch.

In variant embodiments, said voltage monitor is configured as voltage comparator with hysteresis with a first predefined threshold and a second predefined threshold greater than said first predefined threshold.

The present disclosure also provides solutions regarding a circuital arrangement for controlling an electric motor comprising a plurality of half bridge circuits which switch transistors are driven by a respective driver circuit, providing a controlled gate source voltage to each of said transistor, said driver circuit being supplied a regulated voltage through a circuit arrangement according to any of the previous embodiments.

The present disclosure also provides solutions regarding a method for regulating a voltage comprising a circuit according to any of the previous embodiments, comprising generating respective first, second, third and fourth switch signal to control respectively said first switch, second switch, third switch fourth switch, if the input voltage is lower than a first threshold setting the configurable voltage regulating circuit as charge pump by generating the first and second switch signal driven by opposite phases of a clock signal to couple alternatively the common mode to the input voltage and the ground, the third and fourth switch signal are driven by opposite phases of said clock signal to couple alternatively the pump node to the output node and to the charging circuit, if the input voltage is greater than a second threshold said generator setting the configurable voltage regulating circuit as linear regulator by generating a first switch signal keeping the first switch open and a second, third and fourth switch signal keeping the second, third and fourth switch closed.

In variant embodiments, the method comprises monitoring the value of the input voltage and issuing a respective first operation command or second operation mode command to said generator of switch command signals, depending on the value of the input voltage being lower than a first threshold or higher than a second threshold.

In variant embodiments, said second predefined threshold is greater than said first predefined threshold.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
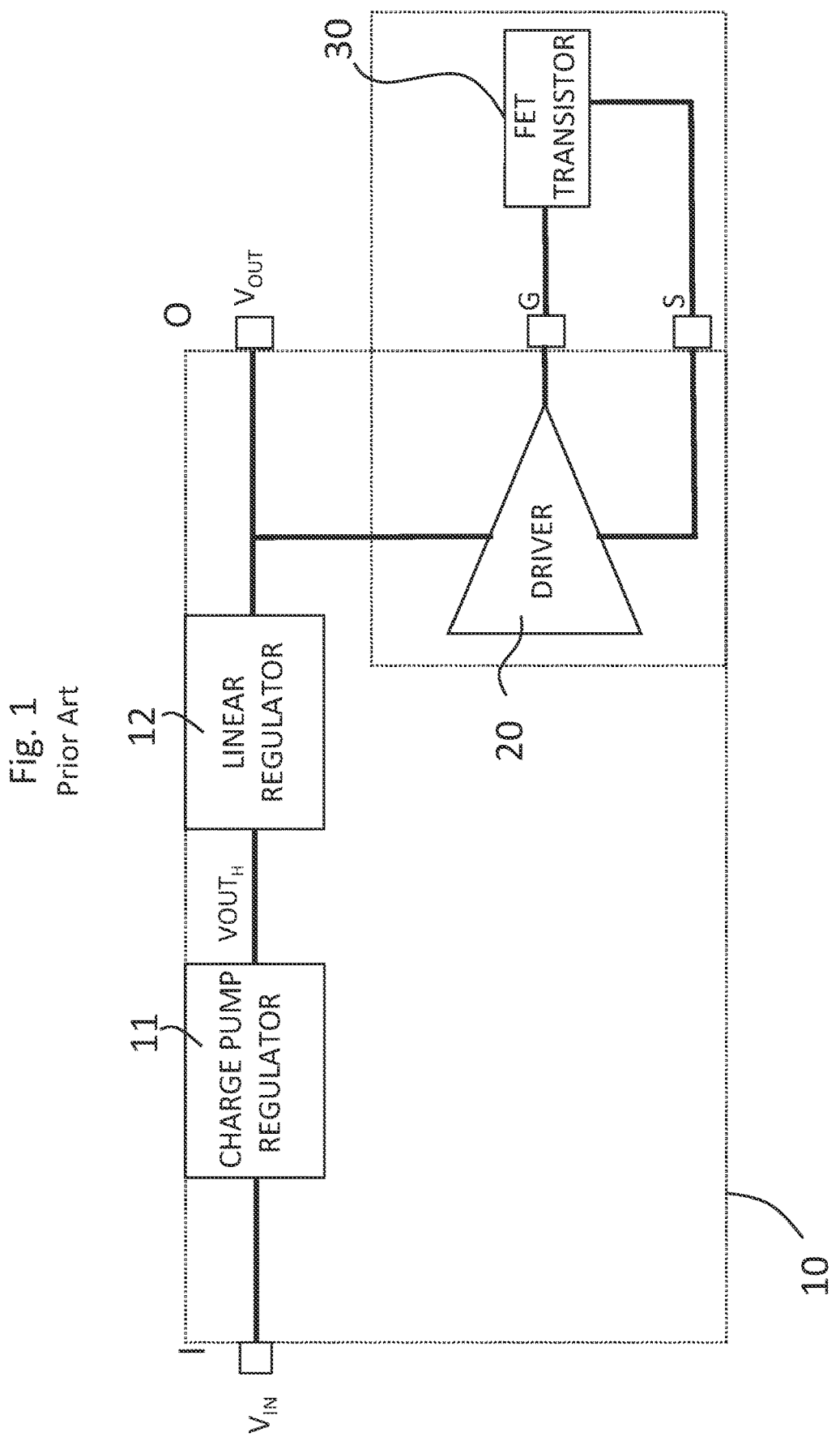
FIG. 1 has already been described in the foregoing.

Figures parts, elements or components which have already been described with reference to FIG. 1 are denoted by the same references previously used in such Figures; the description of such previously described elements will not be repeated in the following in order not to overburden the present detailed description.

The solution in brief refers to a voltage regulator which is able or configured to generate output voltage below and above input voltage, obtained by combining in a single circuit, a low drop out linear regulator and a Dickinson charge pump single-stage. The linear regulator is able to provide an output voltage lower than its input voltage, while the charge pump can provide an output voltage higher than its input voltage. A network of switches under the control of voltage monitor sets the circuit in the linear regulator configuration or charge pump configuration on the basis of the input voltage.

In particular, the circuit described operates in two operating modes:
  linear mode: the voltage monitor checks constantly the input voltage value and activates linear mode, if this value is greater than a predefined threshold; and
  charge pump mode: the same voltage monitor activates charge pump mode if the value of input voltage is lower than a predefined threshold.

Linear regulator and charge pump are not different circuits, but it is a unique architecture where power MOS, drivers, regulation loop and bias network are shared for both the operating mode.

Figure 2:
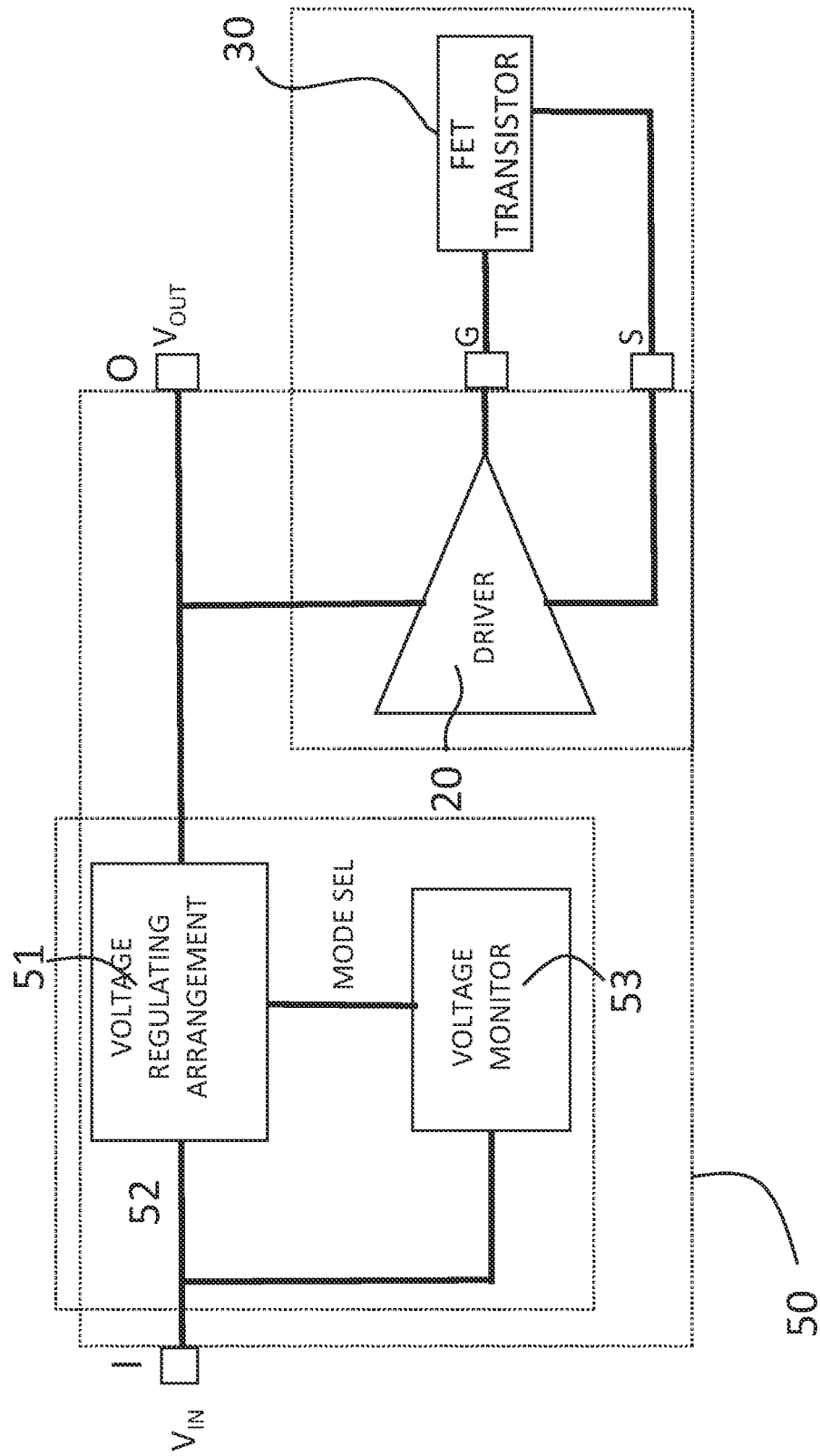
FIG. 2 shows schematically the circuit here described.

In FIG. 2 it is shown schematically an embodiment of the circuit according to such solution.

The circuit corresponds to that of FIG. 1, however instead of the charge pump 11 and the linear regulator 12, it is provided a voltage regulating circuital arrangement 51 comprising a configurable voltage regulator 52, which receives the input voltage VIN, in particular corresponding to the battery voltage VBAT, and it is controlled in its operation, i.e., switching between a charge pump and linear regulator configuration, by a voltage monitor 53, which also receives the input voltage VIN, and generates a mode selection signal MODE SEL supplied to control the configurable voltage regulator 52 in order to switch between a charge pump operation mode or configuration and a linear regulator operation mode or configuration.

Figure 3:
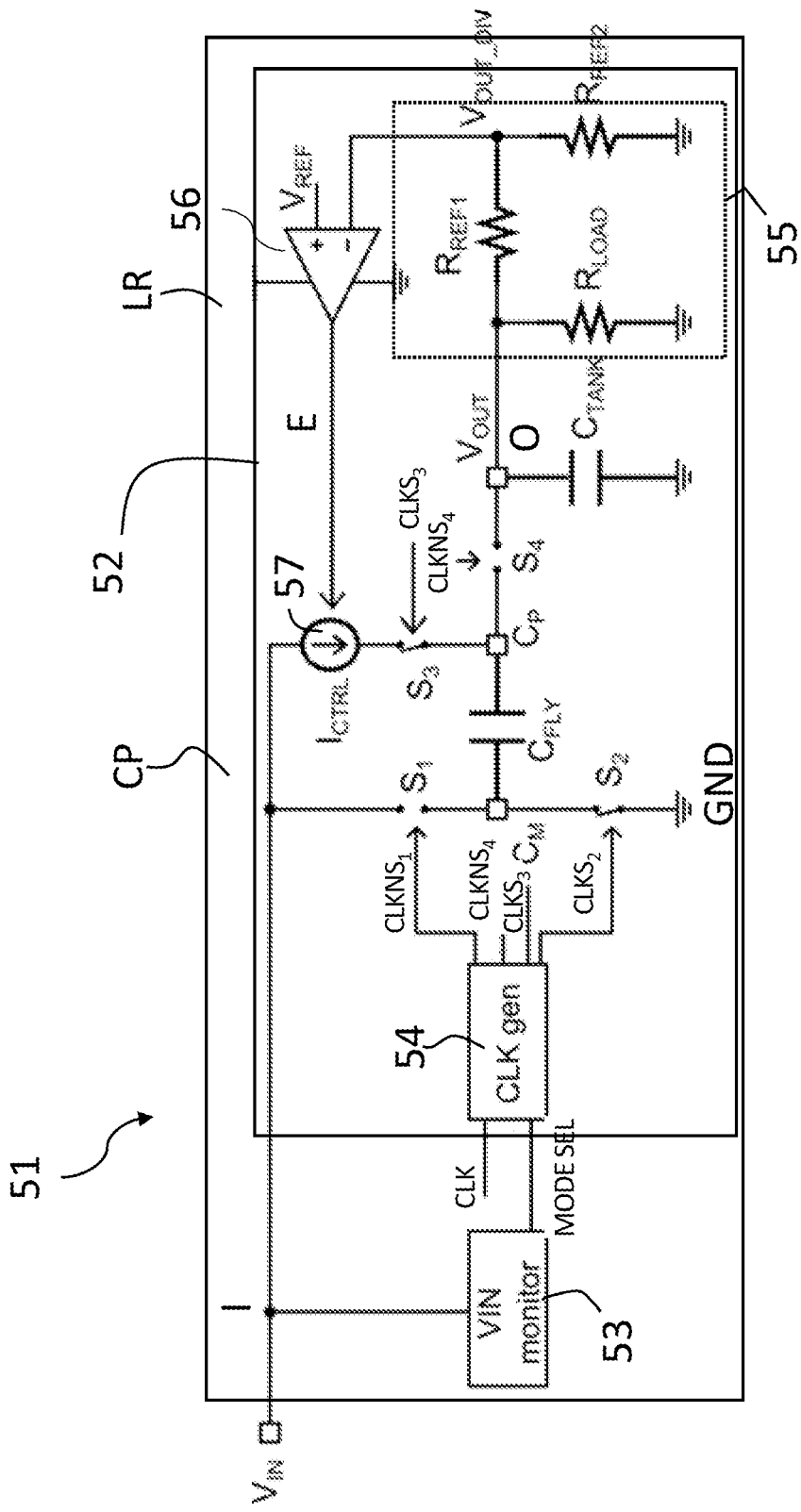
FIG. 3 shows a circuit diagram of a first embodiment of the circuit here described.

In FIG. 3 it is shown a first embodiment of the voltage regulating arrangement 51, which comprises the voltage monitor 53 coupled to the input node I to receive the input voltage VIN, which is the battery voltage in particular, and outputting a selection mode signal MODE SEL.

The configurable voltage regulator 52 includes a clock generation module 54, which receives such selection mode signal MODE SEL. On the basis of the content of the selection mode signal SEL generates four switch signals, i.e., signals controlling the open and close state of switches, e.g., FET or MOSFET switches, a first selection signal CLKNS1 to control a first switch S1, a second selection signal CLKS2 to control a second switch S2, a third selection signal CLKS3 to control a third switch S3 and a fourth selection signal CLKNS4 to control a fourth switch S4.

Then the configurable voltage regulator 52 includes a first pair of switches, S1 and S2, for instance MOSFET switches, the first switch S1 of such first pair being coupled between the input node I and a common node indicate with CM, the second switch S2 of said first pair coupled between the common node CM and the ground node GND. The voltage regulator 52 then includes a flying capacitor CFLY coupled between the common node CM and a pump node CP.

The voltage regulator 52 comprises then a second pair of switches, S3, S4, comprising a third switch S3 coupled between the input node I and the pump node CP and a fourth switch S4 coupled between the pump node CP and the output node O on which the output voltage VOUT is formed. A tank capacitor CTANK is then coupled between the output node O and the ground node GND.

The voltage regulator 52 further comprises a sense resistance network 55 which is embodied by a resistance divider comprising a first resistor RREF1 coupled to the output node O and the inverting input of an error amplifier 54 and a second resistor RREF2 coupled between such inverting input and the ground GND. Through the divider 55 a sensed output voltage VOUT_DIV, i.e., the output voltage VOUT value divided by the ratio of the divider 55, is brought at such inverting input. The error amplifier 55 receives at the other input a reference voltage VREF and supplies an error signal E at its output, which is proportional to the difference of the reference voltage VREF and sensed output voltage VOUT_DIV. Thus, the differential amplifier 54 operates as comparator, comparing the inputs and outputting an error signal proportional to their difference.

The value of the error signal E drives a charging circuit 57, which in this embodiment is embodied by a current generator, coupled between the input node I and the pump node CP, in series with the third switch S3, which is placed between the current generator 57 and the pump node CP. The current generator 57 injects in the pump node CP a charging current ICTRL, which value is controlled by, e.g., proportional to, the error signal E.

Such charging current ICTRL, when the fourth switch S4 is closed, is supplied to the tank capacitor CTANK.

A load resistor RLOAD is shown in parallel with tank capacitor CTANK, to represent the load coupled to the output node OUT. Such load is intended as internal load of integrated circuit 50, due to predriver 20 and external FET 30 current consumption.

The flying capacitor CFLY and the tank capacitor CTANK may be internal to the integrated circuit or external, depending on the realization cost.

When the mode selection signal SEL MODE indicates charge pump mode (VIN is below the nominal value) the clock generator 54 generates the four selection signals on the basis of two clock signals in counterphase, i.e., one the negated of the other, CLK and CLKN. These clock signals CLK and CLKN are generated by the clock generator 54 starting from a clock main, usually present into every integrated circuit. Clock signals CLK and CLKN have a dead time between them in order to avoid cross conduction from input voltage VIN to ground GND, through the path S1-S2.

First selection signal CLKN S1 is equal to fourth selection signal CLKN S4, second selection signal CLK S2 is equal to third selection signal CLK S3.

In a first clock CLK phase PH1, switches S2 and S3 are closed. S1 and S4 are open. Fly capacitance CFLY is charged between ground GND and input voltage VIN with current determined by the value of charging current by ICTRL. Output load, e.g., RLOAD, is fed by tank capacitance CTANK.

In the second clock CLK phase PH2, switches S2 and S3 are open. S1 and S4 are closed. Common node CM raises to the input voltage VIN value and the pump node CP is bootstrapped to a voltage higher than the input voltage VIN.

The charging current ICTRL is OFF and the output load is fed by the fly capacitance CFLY, through the fourth switch S4.

Figure 6:
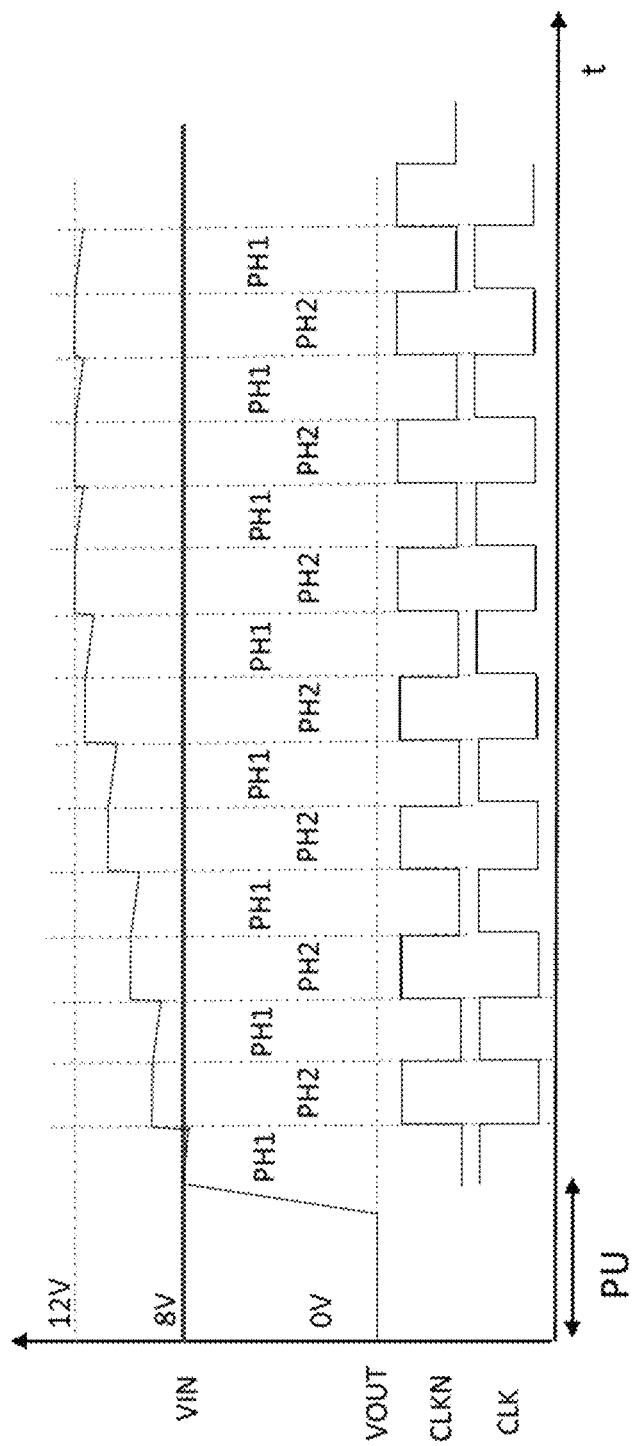
FIG. 6 shows signals of the circuit according to the first embodiment during a first mode of operation.

In FIG. 6 it is shown a time diagram representing the input voltage VIN, the output voltage VOUT, the clock signal CLK and its negated CLKN as a function of time t in charge pump mode in the embodiment of the circuit of FIG. 3.

Initially, there is a power up phase PU, where the circuit 51 operates in in linear mode, then charge pump mode starts.

As shown input voltage VIN is here 8 volts, therefore the voltage monitor is signaling through the SEL MODE signal to operate in charge pump mode, once the PU phase is terminated.

It can be seen that, as indicated above, at the beginning of the second phases PH2, where the pump node CP is bootstrapped to a voltage higher than the input voltage VIN and the output load is fed by the flying capacitance CFLY, through the fourth switch S4, the output voltage OUT has a sharp increase, while during the first phase the output node OUT is fed by the tank capacitance CTANK, as shown by the small decrease in the output voltage as such capacitor discharges.

When the mode selection signal SEL MODE indicates linear mode (VIN is over the nominal value, e.g., over 12V) the switches S1, S2, S3, S4 are controlled differently, in particular are controlled independently. First switch S1 is always open, the other switches S2, S3 and S4 are always close. In this configuration, common node CM is connected to ground GND and fly capacitor CFLY is in parallel to the tank capacitor CTANK (considering negligible the resistance of switches S4 and S2).

The desired output voltage VOUT both in linear mode and charge pump mode is obtained by sensing the output voltage VOUT with the resistor divider 54, i.e., resistors RREF1 and RREF2, comparing it with reference voltage VREF and controlling the charging current ICTRL accordingly on the basis of the error E. Charging current ICTRL has a maximum value in order to limit the output current in case of fault, e.g., output short to ground, short of capacitance plate, etc.

Figure 4:
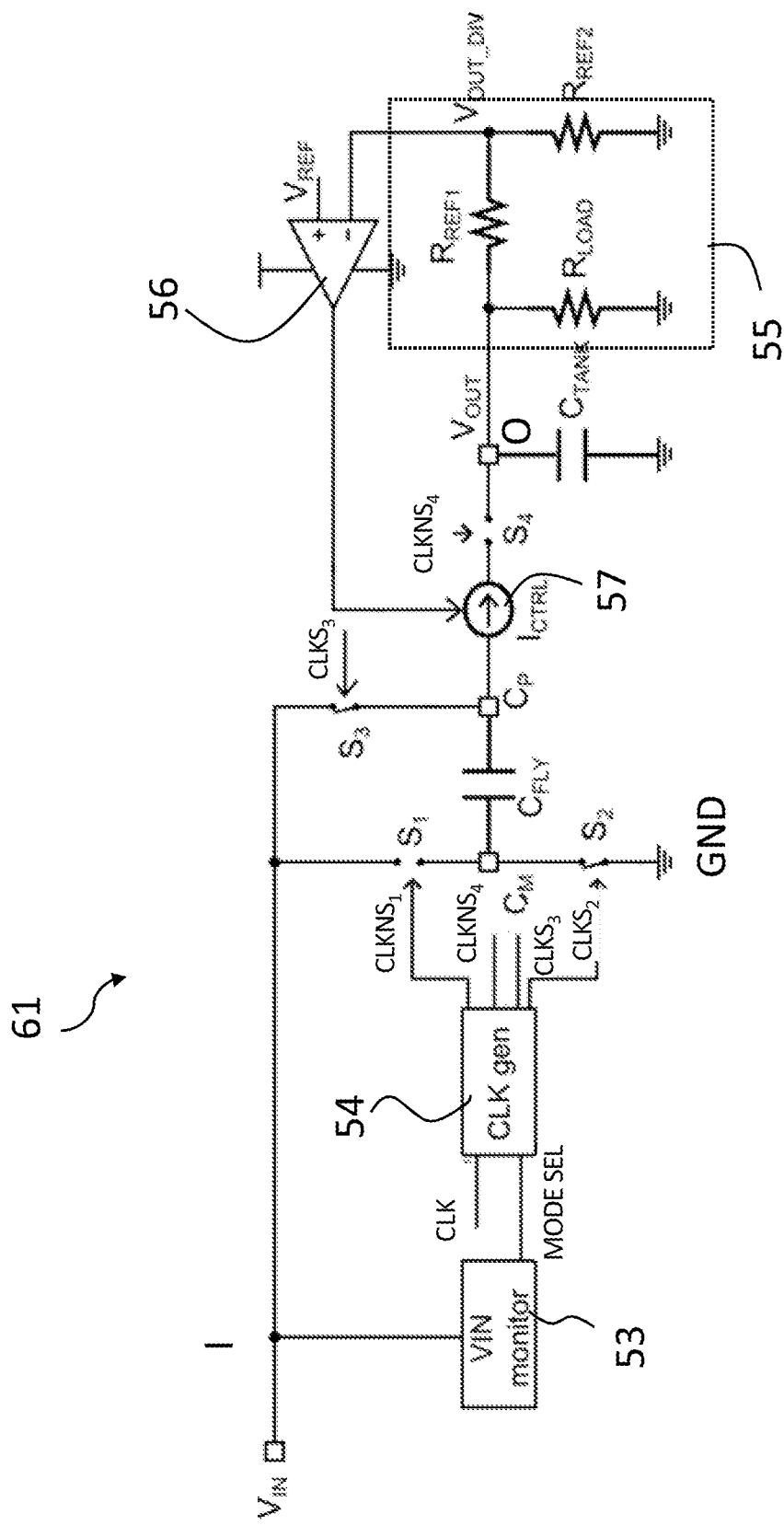
FIG. 4 shows a circuit diagram of a second embodiment of the circuit here described.
Figure 7:
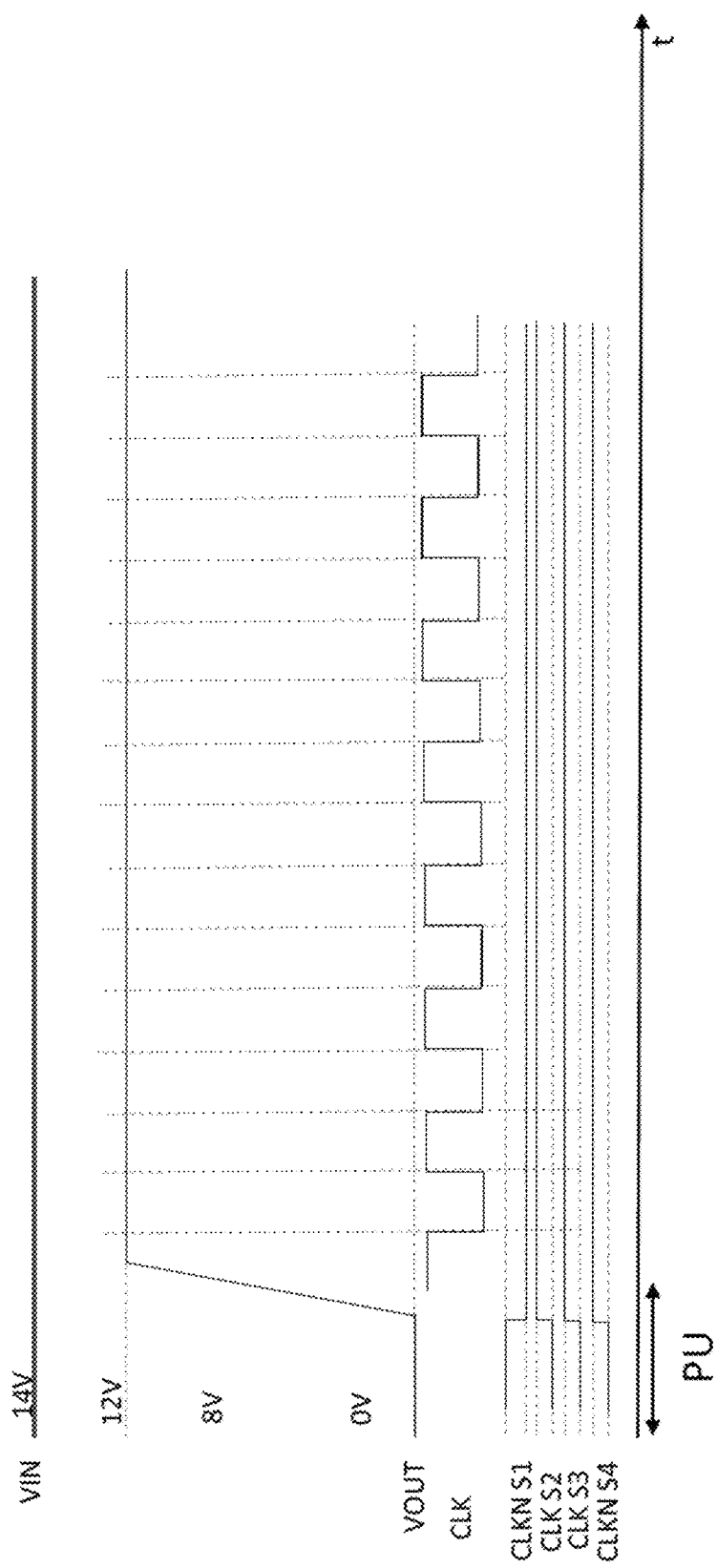
FIG. 7 shows signals of the circuit according to the first embodiment during a second mode of operation.

In FIG. 7 it is shown a time diagram representing the input voltage VIN, the output voltage VOUT, the clock signal CLK and the four switch selections signals CLKNS1, CLKS2, CLKS3, CLKNS4 as a function of time tin linear mode in the embodiment of the circuit of FIG. 4.

Initially, there is a power up phase PU, where the circuit 51 operates in linear mode, then it remains in linear mode.

As shown input voltage VIN is here 14V, therefore the voltage monitor is signaling through the MODE SEL signal to operate in linear mode.

In the example here shown a value of the output voltage VOUT may be 12V, input voltage VIN may be 8V, reference voltage VREF may be 1.2V, resistor RREF1 and RREF2 may be 900 kΩ and 100 kΩ respectively, signal CLK main frequency may be 200 kHz, load resistance RLOAD may range between 500Ω and 1 kΩ, flying capacitor CFLY may be 1 uF, the tank capacitor CTANK may be 4.7 uF. Usually capacitors CFLY and CTANK are external components since ripple requirements on output voltage forces to use capacitance in the order of uF.

In FIG. 4 it is shown a second embodiment 61 of the regulating circuit. Below a second embodiment of proposed solution is reported.

This circuit corresponds to circuit 51 to the exception of the position of current generator 57 embodying the charging circuit, which is in this case coupled between the pump node CP and the output node, upstream of the fourth switch S4, which then when it is closed allows the charging current ICTRL to reach the output node O and charge the tank capacitor CTANK. In other words, in the embodiment of FIG. 3 the current generator 57 is in series to the third switch S3, while in the embodiment of FIG. 4 the generator 57 is placed in series to switch S4.

Figure 5:
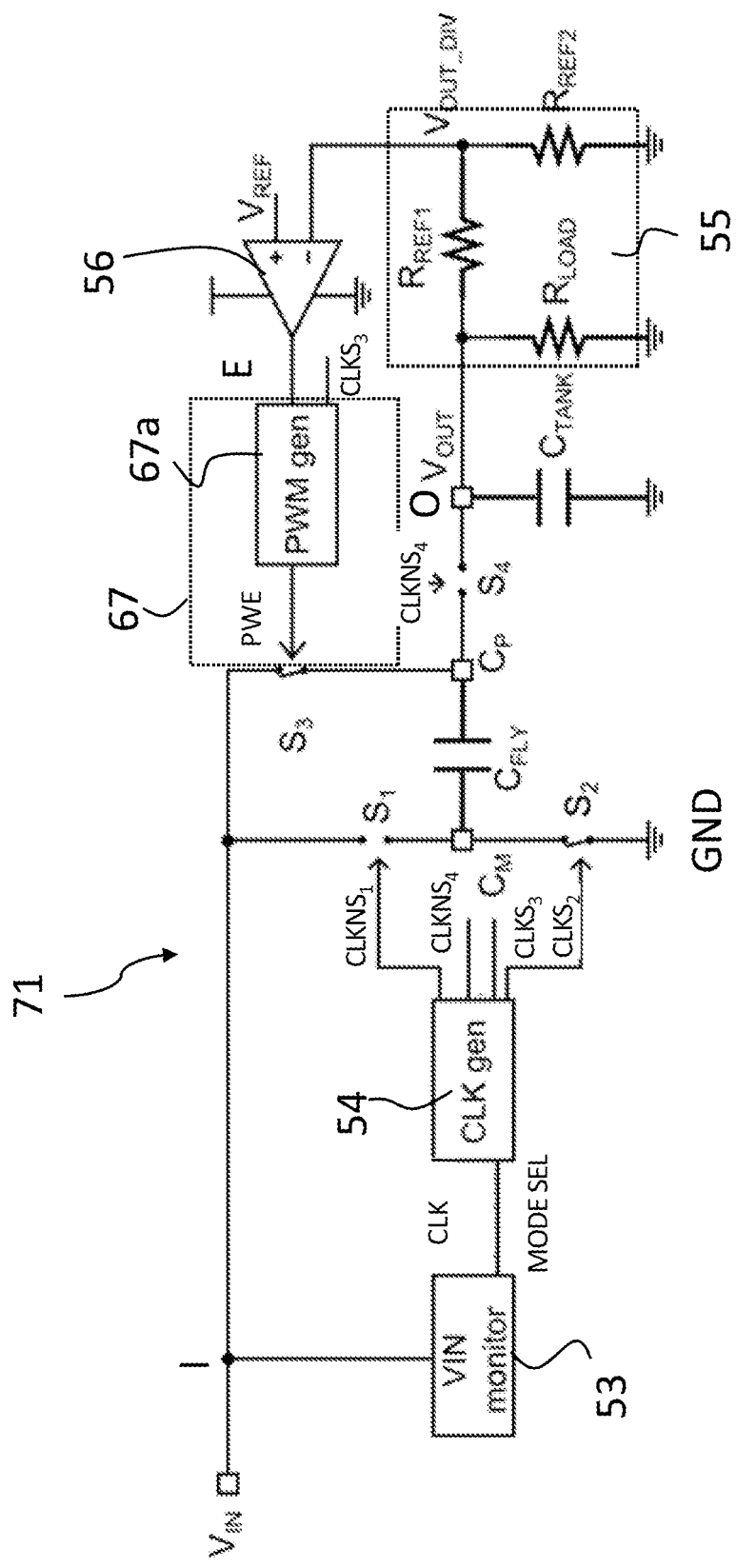
FIG. 5 shows a circuit diagram of a third embodiment of the circuit here described.

In FIG. 5 a third embodiment 71 of the regulating circuit is shown.

The difference in such embodiments regards still the charging circuit, which however is indicated by the reference 67 and includes a PWM generator 67a which receives the error signal E from the differential amplifier 56 and outputs a PWM output signal PWE which drives directly the opening and closing of the third switch S3 instead of being driven by the generator 54. The third selection signal CLK S3 is brought as input of the PWM generator 67a, i.e., controls the third switch S3 through the PWM generator 67a.

Thus, the error signal E between reference voltage VREF and sensed output voltage VOUT_DIV is converted into a pulse with variable width, signal PWE. This pulse controls the third switch S3 turn ON/turn OFF time, thus the total current that charges tank capacitor CTANK and, as a consequence, the regulated voltage VOUT.

By way of example, if the sensed output voltage VOUT_DIV is lower than the reference voltage VREF, then the PWM generator 67a reacts by increasing switch S3 ON time. On the other hand, if the sensed output voltage VOUT_DIV is higher than the reference voltage VREF, then the PWM generator 67a reacts by decreasing ON time of the switch S3, up to turning OFF completely the switch S3, in a sort of «pulse skipping» behavior.

The PWM generator 67a receives, as mentioned the clock signal, i.e., signal CLKS3 that, in the other embodiments, controls S3 in charge pump mode, and it is masked by the PWM modulation.

Figure 8:
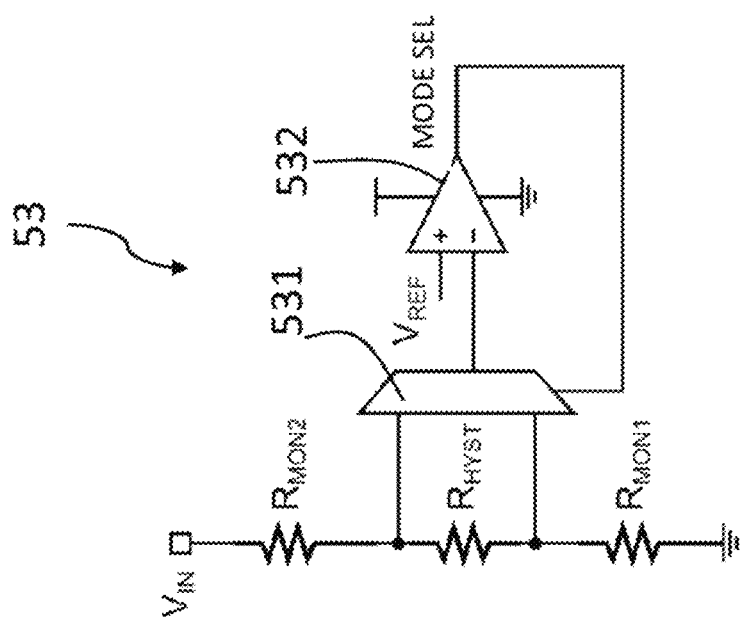
FIG. 8 shows a monitoring module of the circuit according.
Figure 9:
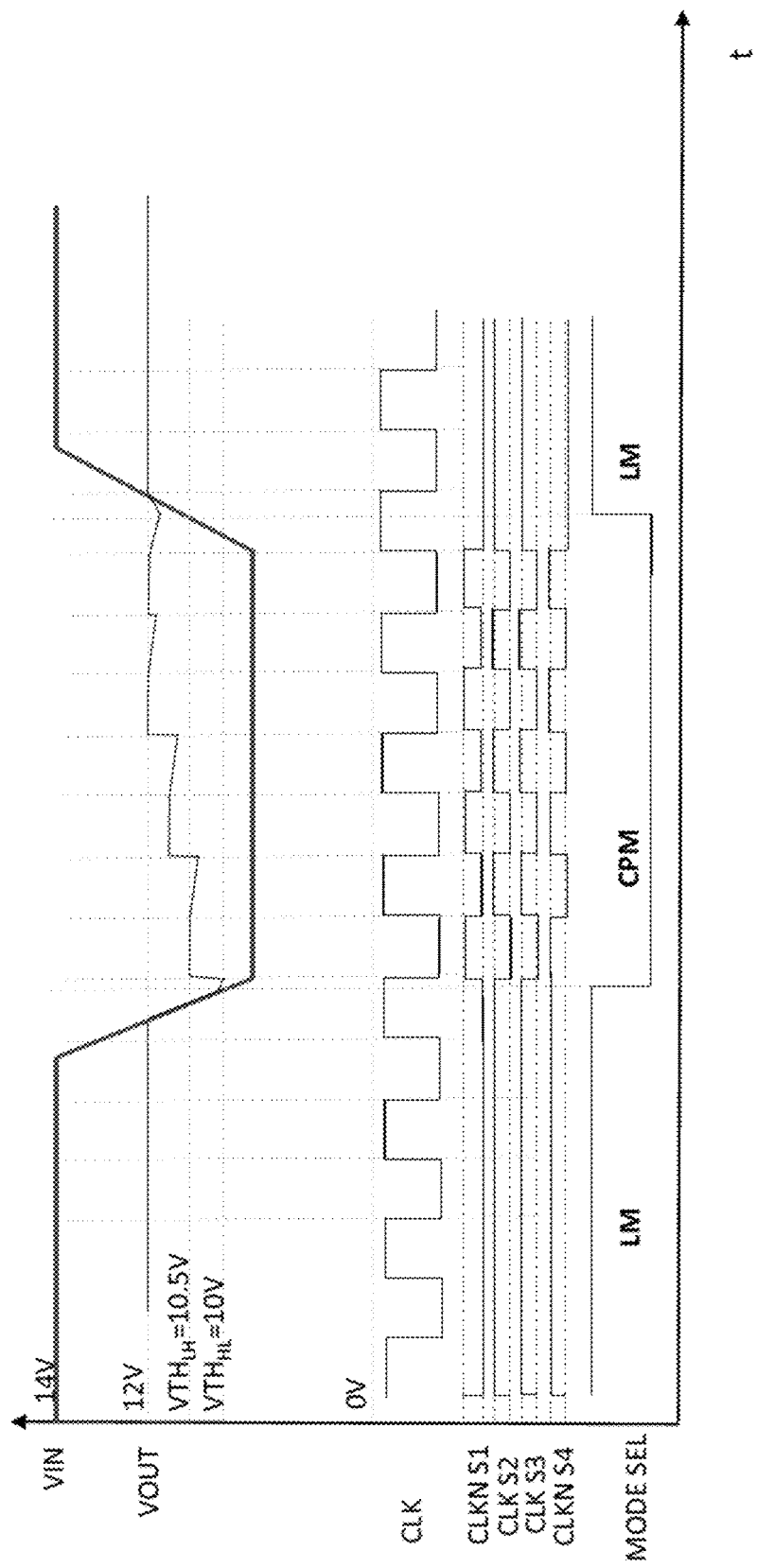
FIG. 9 shows signals of the circuit according to the first embodiment during transitions between modes of operation.

In FIG. 8 it is shown schematically an embodiment of the voltage monitor 53, which comprises a two inputs multiplexer 531 which two inputs are coupled together through a hysteresis resistor RHYST, while one of the inputs is also coupled to the input node I through a monitoring resistor RMON2 and the other is coupled to ground GND through another monitoring resister RMON1. The output of the multiplexer 531 is one of the inputs of a comparator 532 receiving at the other input the reference voltage VREF and outputting the mode selection signal MODE SEL, i.e., a logic signal which, as shown in FIG. 9, indicates linear mode LM when logic high and charge pump mode when logic low.

The mode selection signal MODE SEL is brought as select signal of the multiplexer 531, to generate a hysteresis on the threshold.

The selection of operating mode, linear mode or charge pump mode, is performed by the voltage monitor 53 that sense the input VIN as follows:
  if the input voltage VIN is lower than a first predefined threshold, VTHHL, it means that is necessary to select with MODE SEL the charge pump mode to increase output voltage till the desired value is reached;
  otherwise, if the input voltage VIN is higher than a predefined threshold, VTHLH, it means that linear mode is enough to guarantee the desired value of output voltage, with power dissipation savings. In fact, linear mode is preferable in this case, because the power dissipated during charge pump switching, in linear mode is not present.

The first threshold VTHLH is greater than the second threshold VTHH, in particular by a hysteresis voltage VTHYST.

The voltage monitor 53 is equipped with a hysteresis, obtained through the hysteresis resistor RHYST, to prevent possible oscillation of output regulated voltage, during the transition from charge pump and linear mode and vice versa. Thus, the thresholds may be set with hysteresis i.e., a low to high threshold, e.g., VTHLH=10.5V, and a high to low threshold, e.g., VTHHL=10V, VTHYST of 0.5V being the hysteresis.

Once the values of VREF, RMON1, RMON2 and RHYST are defined, then the thresholds can be obtained using the known equations reported below. Typical value for those parameters are VREF=1.2V, RMON1=95 kΩ, RMON2=730 kΩ, RHYST=5 kΩ

$$VTH_{HL} = VREF * \left(\frac{R_{MON2} + R_{MON1} + R_{HYST}}{R_{MON1} + R_{HYST}}\right) =$$

$$1.2 \text{ V} * \left(\frac{730 \text{ k}\Omega + 95 \text{ k}\Omega + 5 \text{ k}\Omega}{95 \text{ k}\Omega + 5 \text{ k}\Omega}\right) \approx 10 \text{ V}$$

$$VTH_{LH} = VREF * \left(\frac{R_{MON2} + R_{MON1} + R_{HYST}}{R_{MON1}}\right) =$$

$$1.2 \text{ V} * \left(\frac{730 \text{ k}\Omega + 95 \text{ k}\Omega + 5 \text{ k}\Omega}{95 \text{ k}\Omega}\right) \approx 10.5 \text{ V}$$

$$VTH_{HYST} = VTH_{LH} - VTH_{HL} = 500 \text{ mV}$$

The voltage monitor in variant embodiments may use a comparator without hysteresis, i.e., with a single threshold, in other words the first voltage threshold and the second threshold are of equal value.

In FIG. 9 is shown a time diagram of the behavior of the circuit of FIG. 3 in a transition between linear mode and charge pump mode.

The time diagram shows the quantities of FIGS. 7 and 8 plus the mode selection signal MODE SEL, which indicates linear mode LM when logic high and pump charge mode when logic low.

In applicative conditions, input voltage VIN may undergo a variation of its value due to transient load condition or environmental condition (i.e., low temperature operation). In this case, the voltage monitor 53 detects a low battery condition (in the diagram, the input voltage VIN drops from 14V under 10V, under VTHHL, and activates charge pump mode CPM, that restores the output voltage VOUT to the desired value. In the diagram it can be also observed that when the input voltage VIN surpasses then 10.5V, over VTHLH, then the circuit 52 passes in linear mode.

Figure 10:
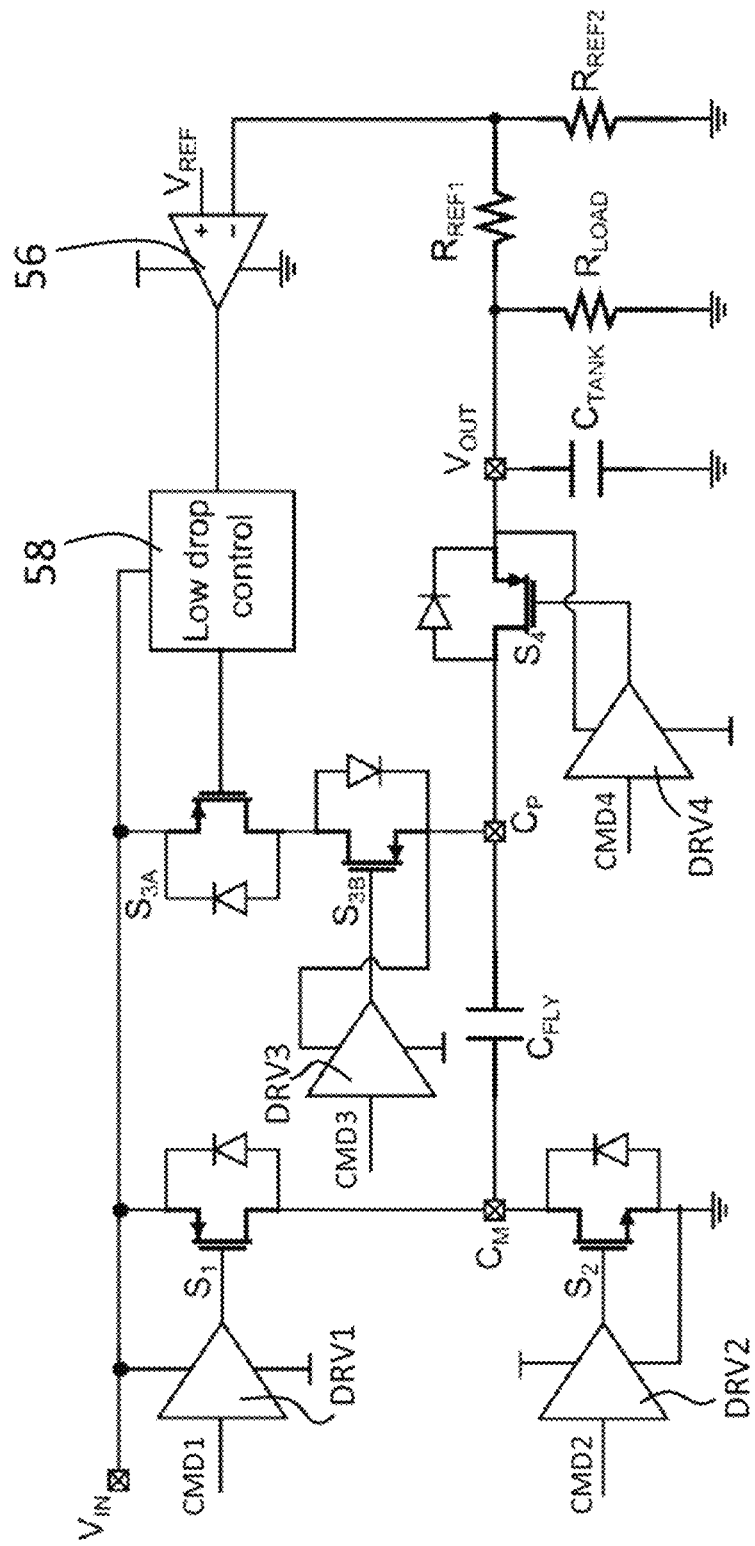
FIG. 10 shows a circuit diagram of variant embodiment of the first embodiment of the circuit here described.
Figure 11:
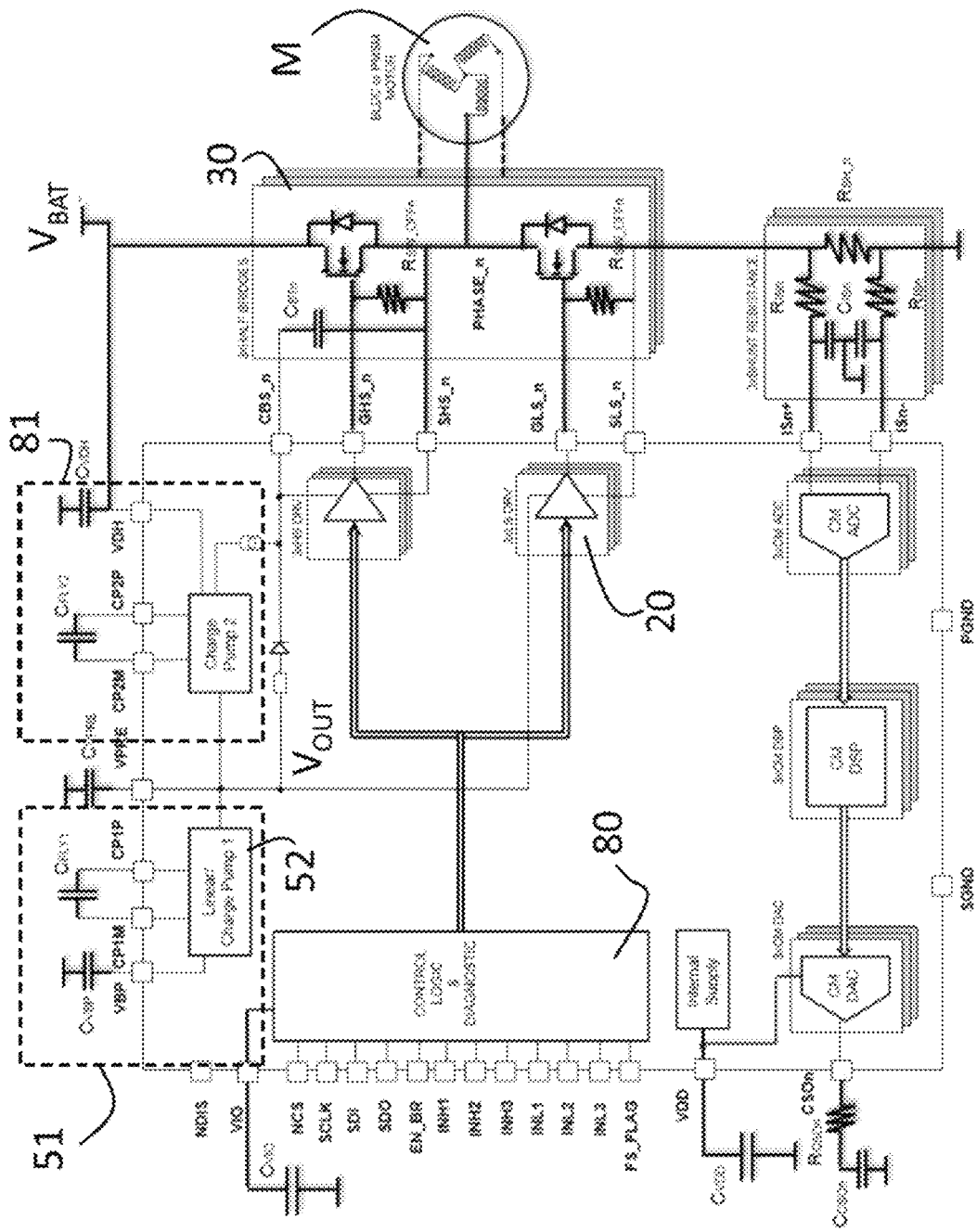
FIG. 11 shows a circuit diagram of a circuit for controlling an electric motor using the circuit here described.

In FIG. 10 it is shown an implementation detail of the circuit of FIG. 3. The switches S1, S2, S3, S4 here are implemented through high voltage switches, e.g., high voltage MOSFET, driven by respective drivers DRV1, DRV2, DRV3, DRV4.

The third switch S3 is composed by two switches S3A, S3B coupled in series between the input node I and the pump node CP: switch S3A, which is coupled to the input node I and receives the error signal E at its control input, is used for limiting the current and for closing the control loop of regulated output voltage VOUT. Switch S3B, coupled to the pump node CP, is driven by a driver, DRV3, with one of the selection signals, i.e., CMD3, i.e., substantially by the third switch signal, is used to avoid reverse current flow into the input voltage VIN when charge pump mode is active in bootstrap phase. In linear mode S3B is always active, i.e., close.

The clock generator 54 generates commands CMD1, CMD2, CMD3 and CMD4 for pre-drivers DRV1, DRV2, DRV3, DRV4, which correspond to switch signal CLKNS1, CLKS2, CLKS3, CLKNS4 in behavior.

In charge pump mode, commands CMD1 and CMD4 are thus in counterphase with CMD2 and CMD3 and a deadtime is present between them. In linear mode, S3A, S3B, S4 and S2 are always ON, while S1 is kept OFF.

A low drop control module 58, is inserted between the error signal E and the gate of switch S3A, configured to force switch S3A to operate with full or limited gate source voltage VGS voltage depending on the current required by the load.

A low drop control module 58, is made of a comparator provided with a certain threshold and an analog circuit that control gate source voltage of switch S3A. The comparator senses the drain voltage of switch S3A and the analog circuit reacts by setting gate source voltage of S3A to full or limited range. In case a high current is required by the load, high drop is present on switch S3A and consequently drain voltage reduces below comparator threshold, therefore low drop control module limits gate source voltage of switch S3A to limit the load current. Otherwise, if low current is required by the load, low drop is present on switch S3A and consequently drain voltage increases above comparator threshold, therefore low drop control module forces the full gate source voltage to reduce the ON resistance of MOSFET switch S3A and to keep as low as possible the drop across switch S3A. The drop reduction on switch S3A improves system performance (i.e., the desired VOUT voltage and gate source voltage of external FET).

The typical application of the circuit in the embodiments of FIG. 4, 5, 6 is in the control of a brush less DC three phase motor driving.

In this case, the voltage regulator 51 is equipped with a fly capacitance CFLY1, and a tank capacitance CVPRE. Node CP1M corresponds to common node CM, while node CP1P corresponds to pump node CP. This circuit, supplied by an input voltage VIN indicated with VBP, is responsible of supplying gate pre-driver 20 of low side and high side external FETs 30. Depending on the application battery (12V, 24V or 48V depending on the vehicle) voltage VBP is shorted directly to battery voltage VBAT (i.e., 12V or 24V) or it is obtained by the battery voltage VBAT through a step down converter. A decoupling capacitor CVBP is connected to remove battery noise. In this case reference 30 indicates three half bridge circuits driving the three phase of electric motor M, and including three high side FETs and three low side FETS, while 20 indicates the six corresponding pre-drivers. The low side pre-drivers gate voltage in this case is supplied by the output voltage VOUT of the circuit 51, while the high side pre-driver voltage is supplied by a bootstrap capacitor CBTx, coupled through the supply terminals of the driver 20, which is precharged by the voltage of the circuit 51.

With 80 is indicated a logic module which provides the signal driving the three half bridge circuits.

A second regulator 81, which is a charge pump, is present only to improve performance of the system and could help to provide the charging current for turning OFF the high side FET 30 only when high duty cycle are requested by the motor control strategy.

The FET transistors in variant embodiments can be any type of field effect transistors, e.g., MOSFETs, used in the bridge and half-bridge circuits, in particular to drive electric motors.

The described solution thus has several advantages with respect to the prior art solutions.

The circuit here described allows to provide a voltage regulator with output greater or lower than input voltage, where, by the architecture described, only external capacitances are needed or otherwise utilized, avoiding the use of expensive external components like inductance, FET or diode.

Of course, without prejudice to the principle of the disclosure, the details of construction and the embodiments may vary widely with respect to what has been described and illustrated herein purely by way of example, without thereby departing from the scope of the present disclosure.

An electronic circuit (51) for regulating a voltage (VIN) received at its input may be summarized as including a configurable voltage regulating circuit (52) including a first switch (S1) coupled between the input node (I) and a common mode node (CM), a second switch (S2) being coupled between said common mode node (CM) and a ground node (GND), a flying capacitor (CFLY) coupled between the common mode node (CM) and a pump node (CP), a third switch (S3) coupled between the input node (I) and a pump node (CP) and a fourth switch coupled between the pump node (CP) and an output node (O) of the circuit (51) for regulating a voltage (VIN), the circuit further comprising a sense resistance network (55), in particular a resistance divider, coupled between the output node (O) and the input of an error amplifier (56) to provide at such input a sensed output voltage (VDIV_OUT), said error amplifier (56) receiving at its other input a reference voltage (VREF) and generating an error signal (E), a charging circuit (57; 67) supplying a charging current (ICTRL) to said pump node (CP), said charging circuit (ICTRL) controlling the value of said charging current (ICTRL) as a function of said error control signal (E), a generator of switch command signals (54) configured to generate respective first, second, third and fourth switch signal to control respectively said first switch (S1), second switch (S2), third switch (S3) fourth switch (S4), said generator (54) if the input voltage is lower than a first threshold said generator (54) being configured to set the configurable voltage regulating circuit (52) as charge pump by generating the first (CLKNS1) and second switch signal (CLKS2) driven by opposite phases of a clock signal (CLK) to couple alternatively the common mode to the input voltage and the ground, the third (CLKS3) and fourth switch signal (CLKNS4) are driven by opposite phases of said clock signal (CLK) to couple alternatively the pump node (CP) to the output node (O) and to the charging circuit (57; 67), if the input voltage is greater than a second threshold said generator (54) being configured to set the configurable voltage regulating circuit (52) as linear regulator by generating a first switch signal (CLKNS1) keeping the first switch (S1) open and a second, third and fourth switch signal (CLKS2, CLKS3, CLKNS4) keeping the second (S2), third (S3) and fourth (S4) switch closed.

Said configurable regulating circuit (52) may include a voltage monitoring circuit (53) configured to monitor the value of the input voltage (VIN) and to issue a respective first (CMP) operation command or second (LM) operation mode command (SEL MODE) to said generator of switch command signals (54), depending on the value of the input voltage (VIN) being lower than a first threshold (VTHHL) or higher than a second threshold (VTHLH).

A tank capacitor (CTANK) may be coupled between the output node (O) and the ground (GND).

Said charging circuit may be a controlled current generator (57)

Said controlled current generator (57) may be coupled between the input node and the pump node Said controlled current generator may be coupled between the pump node and the output node Said charging circuit may include a PWM signal generator (67) generating a PWM signal (PWE) proportional to said error signal (E), said PWM signal (PWE) driving the open and closed state of said third switch (S3).

Said voltage monitor (53) may be configured as voltage comparator with hysteresis with a first predefined threshold (VTHHL) and a second predefined threshold (VTHLH) greater than said first predefined threshold (VTHHL).

A circuital arrangement for controlling an electric motor may be summarized as including a plurality of half bridge circuits which switch transistors (30) are driven by a respective driver circuit (20), providing a controlled gate source voltage to each of said transistor (30), said driver circuit (20) being supplied a regulated voltage through a circuit arrangement.

A method for regulating a voltage including an electronic circuit (51) for regulating a voltage (VIN) received at its input, may be summarized as including generating respective first, second, third and fourth switch signal to control respectively said first switch (S1), second switch (S2), third switch (S3) fourth switch (S4), if the input voltage is lower than a first threshold setting the configurable voltage regulating circuit (52) as charge pump by generating the first (CLKNS1) and second switch signal (CLKS2) driven by opposite phases of a clock signal (CLK) to couple alternatively the common mode to the input voltage and the ground, the third (CLKS3) and fourth switch signal (CLKNS4) are driven by opposite phases of said clock signal (CLK) to couple alternatively the pump node (CP) to the output node (O) and to the charging circuit (57; 67), if the input voltage is greater than a second threshold said generator (54) setting the configurable voltage regulating circuit (52) as linear regulator by generating a first switch signal (CLKNS1) keeping the first switch (S1) open and a second, third and fourth switch signal (CLKS2, CLKS3, CLKNS4) keeping the second (S2), third (S3) and fourth (S4) switch closed.

The method may include monitoring the value of the input voltage (VIN) and issuing a respective first (CMP) operation command or second (LM) operation mode command (SEL MODE) to said generator of switch command signals (54), depending on the value of the input voltage (VIN) being lower than a first threshold (VTHHL) or higher than a second threshold (VTHLH).

Said second predefined threshold (VTHLH) may be greater than said first predefined threshold (VTHHL).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic circuit, comprising:
an input node configured to receive an input voltage; and
a configurable voltage regulating circuit, including:
a first switch coupled between the input node and a common mode node;
a second switch coupled between said common mode node and a ground node;
a flying capacitor coupled between the common mode node and a pump node;
a third switch coupled between the input node and the pump node;
a fourth switch coupled between the pump node and an output node;
an error amplifier having a first input and a second input;
a sense resistance network coupled between the output node and the first input of the error amplifier, the sense resistance network configured to provide a sensed output voltage at the first input of the error amplifier, said error amplifier receiving a reference voltage at the second input and configured to generate an error signal;
a charging circuit configured to supply a charging current to said pump node, said charging circuit configured to control a value of said charging current as a function of said error signal; and
a switch command signal generator configured to generate respective first, second, third, and fourth switch signals to control respectively said first switch, second switch, third switch, and fourth switch,
wherein, if the input voltage is lower than a first threshold, said switch command signal generator being configured to set the configurable voltage regulating circuit as a charge pump by generating the first and second switch signals driven by opposite phases of a clock signal to couple alternatively the common mode to the input voltage and the ground, the third and fourth switch signals being driven by opposite phases of said clock signal to couple alternatively the pump node to the output node and to the charging circuit, and
if the input voltage is greater than a second threshold, said switch command signal generator being configured to set the configurable voltage regulating circuit as a linear regulator by generating the first switch signal keeping the first switch open and the second, third, and fourth switch signals keeping the second, third, and fourth switches closed.

2. The circuit of claim 1, wherein said configurable voltage regulating circuit includes a voltage monitoring circuit configured to monitor a value of the input voltage and to issue a respective first operation command or second operation mode command to said switch command signal generator, depending on the value of the input voltage being lower than the first threshold or higher than the second threshold.

3. The circuit of claim 1, wherein the configurable voltage regulating circuit includes a tank capacitor coupled between the output node and the ground.

4. The circuit of claim 1, wherein said charging circuit is a controlled current generator.

5. The circuit of claim 4, wherein said controlled current generator is coupled between the input node and the pump node.

6. The circuit of claim 4, wherein said controlled current generator is coupled between the pump node and the output node.

7. The circuit of claim 1, wherein said charging circuit includes a pulse width modulation (PWM) signal generator configured to generate a PWM signal proportional to said error signal, said PWM signal configured to drive an operation of said third switch into an open state or a closed state.

8. The circuit of claim 2, wherein said voltage monitoring circuit is configured as a voltage comparator with hysteresis having a first predefined threshold and a second predefined threshold greater than said first predefined threshold.

9. A circuit for controlling an electric motor, comprising:
a plurality of half bridge circuits, each of the half bridge circuits including a respective transistor;
a plurality of driver circuits, each of the driver circuits configured to provide a controlled gate source voltage to a respective transistor of a respective one of the half bridge circuits; and
a configurable voltage regulating circuit configured to supply a regulated voltage to the plurality of driver circuits, the configurable voltage regulating circuit including:
a first switch coupled between an input node and a common mode node;
a second switch coupled between said common mode node and a ground node;
a flying capacitor coupled between the common mode node and a pump node;
a third switch coupled between the input node and the pump node;
a fourth switch coupled between the pump node and an output node;
an error amplifier having a first input and a second input;
a sense resistance network coupled between the output node and the first input of the error amplifier, the sense resistance network configured to provide a sensed output voltage at the first input of the error amplifier, said error amplifier receiving a reference voltage at the second input and configured to generate an error signal;
a charging circuit configured to supply a charging current to said pump node, said charging circuit configured to control a value of said charging current as a function of said error signal; and
a switch command signal generator configured to generate respective first, second, third, and fourth switch signals to control respectively said first switch, second switch, third switch, and fourth switch,
wherein, if the input voltage is lower than a first threshold, said switch command signal generator being configured to set the configurable voltage regulating circuit as a charge pump by generating the first and second switch signals driven by opposite phases of a clock signal to couple alternatively the common mode to the input voltage and the ground, the third and fourth switch signals being driven by opposite phases of said clock signal to couple alternatively the pump node to the output node and to the charging circuit, and
if the input voltage is greater than a second threshold, said switch command signal generator being configured to set the configurable voltage regulating circuit as a linear regulator by generating the first switch signal keeping the first switch open and the second, third, and fourth switch signals keeping the second, third, and fourth switches closed.

10. The circuit of claim 9, wherein the configurable voltage regulating circuit includes a voltage monitoring circuit configured to monitor a value of the input voltage and to issue a respective first operation command or second operation mode command to said switch command signal generator, depending on the value of the input voltage being lower than the first threshold or higher than the second threshold.

11. The circuit of claim 9, wherein the configurable voltage regulating circuit includes a tank capacitor coupled between the output node and the ground.

12. The circuit of claim 9, wherein said charging circuit is a controlled current generator.

13. The circuit of claim 12, wherein the controlled current generator is coupled between the input node and the pump node.

14. The circuit of claim 12, wherein the controlled current generator is coupled between the pump node and the output node.

15. The circuit of claim 9, wherein the charging circuit includes a pulse width modulation (PWM) signal generator configured to generate a PWM signal proportional to said error signal, said PWM signal configured to drive an operation of said third switch into an open state or a closed state.

16. The circuit of claim 10, wherein the voltage monitoring circuit is configured as a voltage comparator with hysteresis having a first predefined threshold and a second predefined threshold greater than said first predefined threshold.

17. A method for regulating a voltage, comprising:
receiving an input voltage at an input node;
generating respective first, second, third and fourth switch signals to control respectively a first switch, a second switch, a third switch, and a fourth switch of a configurable voltage regulating circuit, the configurable voltage regulating circuit including a flying capacitor coupled between a common mode node and a pump node, an error amplifier having a first input and a second input, a sense resistance network coupled between an output node and the first input of the error amplifier, the sense resistance network configured to provide a sensed output voltage at the first input of the error amplifier, the error amplifier configured to receive a reference voltage at the second input and generate an error signal, a charging circuit configured to supply a charging current to the pump node, the charging circuit configured to control a value of the charging current as a function of the error signal, and a switch command signal generator configured to generate respective first, second, third, and fourth switch signals to respectively control the first switch, second switch, third switch, and fourth switch, wherein the first switch is coupled between the input node and the common mode node, the second switch is coupled between the common mode node and a ground node, the third switch is coupled between the input node and the pump node, and the fourth switch is coupled between the pump node and the output node;
if the input voltage is lower than a first threshold, setting the configurable voltage regulating circuit as a charge pump by generating the first and second switch signals driven by opposite phases of a clock signal to couple alternatively the common mode to the input voltage and the ground, the third and fourth switch signal are driven by opposite phases of said clock signal to couple alternatively the pump node to the output node and to the charging circuit, and
if the input voltage is greater than a second threshold, setting, by the switch command signal generator, the configurable voltage regulating circuit as a linear regulator by generating the first switch signal keeping the first switch open and the second, third, and fourth switch signals keeping the second, third, and fourth switches closed.

18. The method of claim 17, further comprising:
monitoring a value of the input voltage and issuing a respective first operation command or second operation mode command to the switch command signal generator, depending on the value of the input voltage being lower than the first threshold or higher than the second threshold.

19. The method of claim 18, wherein the second threshold is greater than the first threshold.

20. The method of claim 17, further comprising:
generating, by a pulse width modulation (PWM) signal generator, a PWM signal proportional to the error signal; and
driving, by the PWM signal, an operation of the third switch into an open state or a closed state.

* * * * *